(12) United States Patent
Classen

(10) Patent No.: US 11,623,861 B2
(45) Date of Patent: Apr. 11, 2023

(54) MICROMECHANICAL COMPONENT FOR A SENSOR DEVICE AND MANUFACTURING METHOD FOR A MICROMECHANICAL COMPONENT FOR A SENSOR DEVICE

(71) Applicant: Robert Bosch GmbH, Stuttgart (DE)

(72) Inventor: Johannes Classen, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 121 days.

(21) Appl. No.: 17/169,250

(22) Filed: Feb. 5, 2021

(65) Prior Publication Data

US 2021/0246012 A1  Aug. 12, 2021

(30) Foreign Application Priority Data

Feb. 10, 2020 (DE) .......................... 102020201576.7

(51) Int. Cl.
*B81B 3/00* (2006.01)
*B81C 1/00* (2006.01)

(52) U.S. Cl.
CPC .......... *B81B 3/007* (2013.01); *B81C 1/00658* (2013.01); *B81B 2201/025* (2013.01); *B81B 2201/0257* (2013.01); *B81B 2201/0264* (2013.01); *B81B 2203/0127* (2013.01); *B81B 2203/0353* (2013.01); *B81B 2203/04* (2013.01); *B81B 2207/012* (2013.01); *B81B 2207/115* (2013.01); *B81C 2201/0132* (2013.01)

(58) Field of Classification Search
CPC ..................................................... B81B 3/007
See application file for complete search history.

(56) References Cited

U.S. PATENT DOCUMENTS

| 2014/0001579 | A1* | 1/2014 | Liu ..................... B81C 1/00182 438/53 |
| 2014/0109680 | A1 | 4/2014 | Tsai |
| 2015/0068314 | A1 | 3/2015 | Nakamura et al. |
| 2019/0164807 | A1* | 5/2019 | Wachtler ........... H01L 23/49548 |

FOREIGN PATENT DOCUMENTS

| CN | 102249177 A | 11/2011 |
| DE | 102006024671 A1 | 11/2007 |
| DE | 60225402 T2 | 3/2009 |

(Continued)

*Primary Examiner* — Moazzam Hossain
(74) *Attorney, Agent, or Firm* — Norton Rose Fulbright US LLP; Gerard Messina

(57) ABSTRACT

A micromechanical component for a sensor device including a substrate having a substrate surface, at least one stator electrode situated on the substrate surface and/or on the at least one intermediate layer covering at least partially the substrate surface, which is formed in each case from a first semiconductor and/or metal layer, at least one adjustably situated actuator electrode, which is formed in each case from a second semiconductor and/or metal layer, and a diaphragm spanning the at least one stator electrode and the at least one actuator electrode, including a diaphragm exterior side directed away from the at least one stator electrode, which is formed from a third semiconductor and/or metal layer, a stiffening and/or protective structure protruding at the diaphragm exterior side being formed from a fourth semiconductor and/or metal layer.

7 Claims, 8 Drawing Sheets

(56) References Cited

FOREIGN PATENT DOCUMENTS

| | | |
|---|---|---|
| DE | 102011078937 A1 | 1/2012 |
| DE | 112011105850 T5 | 7/2014 |
| DE | 102014200512 A1 | 7/2015 |
| DE | 102015108918 A1 | 12/2015 |
| DE | 102014224063 B3 | 3/2016 |
| DE | 102017211451 A1 | 1/2019 |
| DE | 102019205347 A1 | 10/2020 |

* cited by examiner

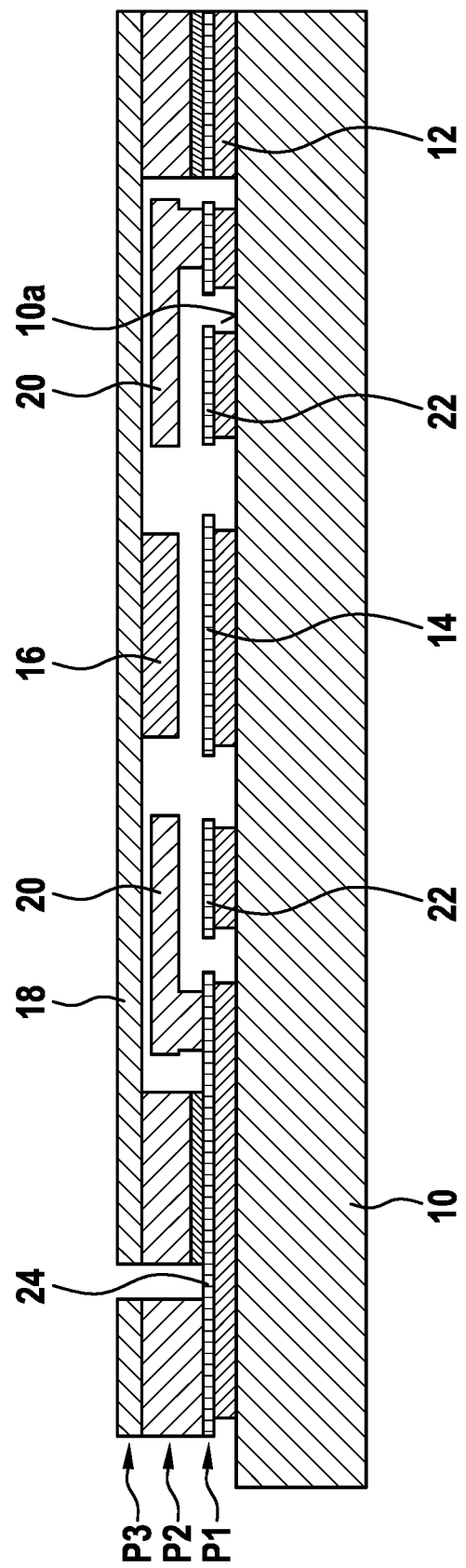

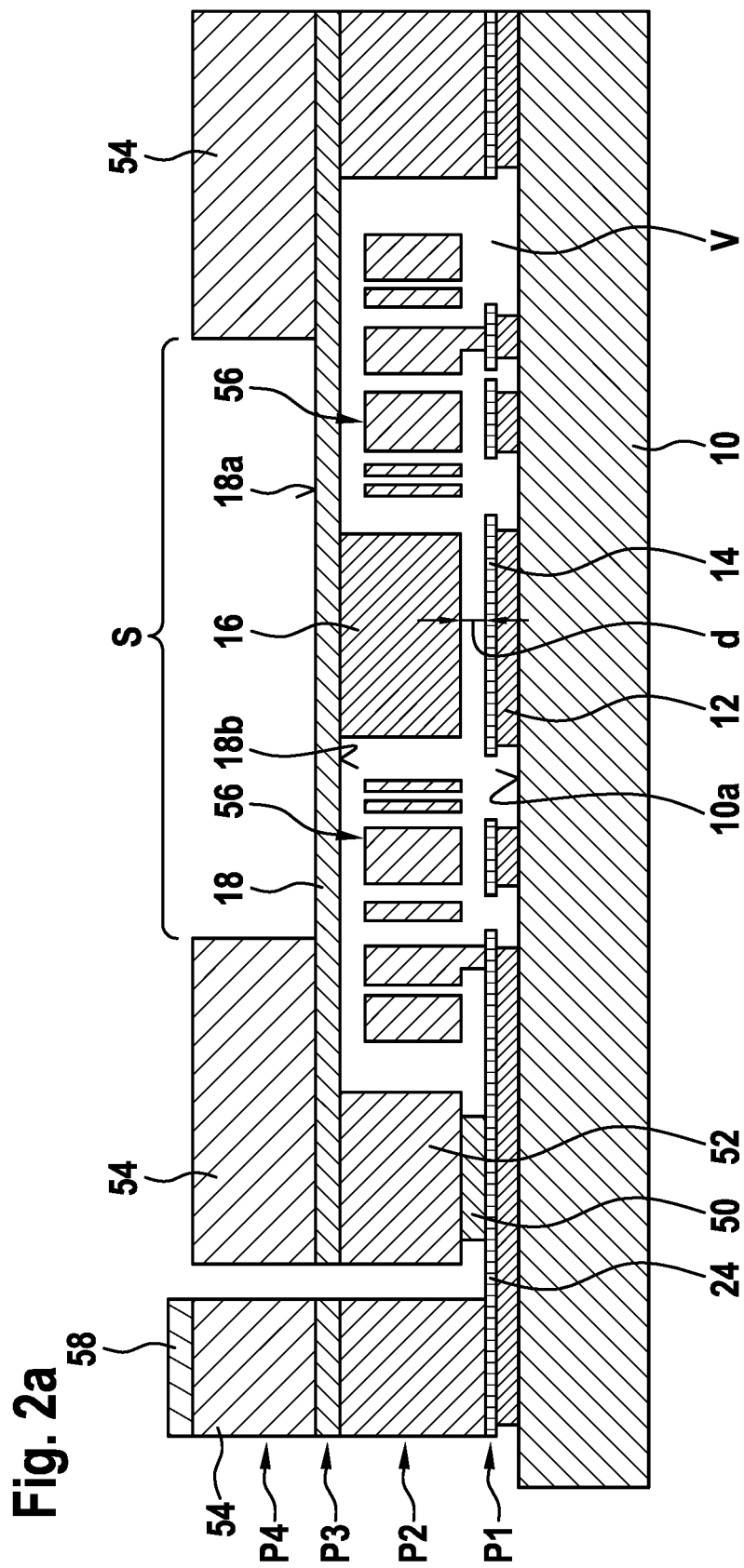

MICROMECHANICAL COMPONENT FOR A SENSOR DEVICE AND MANUFACTURING METHOD FOR A MICROMECHANICAL COMPONENT FOR A SENSOR DEVICE

CROSS REFERENCE

The present application claims the benefit under 35 U.S.C. § 119 of German Patent Application No. DE 102020201576.7 filed on Feb. 10, 2020, which is expressly incorporated herein by reference in its entirety.

FIELD

The present invention relates to a micromechanical component for a sensor device and to a sensor device. The present invention also relates to a manufacturing method for a micromechanical component for a sensor device.

BACKGROUND INFORMATION

FIGS. 1a and 1b schematically show partial and overall views of a conventional semiconductor device, which is internal related art.

The semiconductor device partially represented in FIG. 1a includes a substrate 10 that includes an intermediate layer 12 covering at least partially a substrate surface 10a of substrate 10. At least one stator electrode 14, which is formed from a first semiconductor and/or metal layer P1, is situated on intermediate layer 12. The conventional semiconductor device also includes at least one actuator electrode 16, which is formed from a second semiconductor and/or metal layer P2. The at least one actuator electrode 16 is suspended at a diaphragm 18 formed from a third semiconductor and/or metal layer P3 in such a way that the at least one actuator electrode 16 is adjustable/is to be adjusted with respect to the at least one stator electrode 14 with the aid of a pressure-induced or sound wave-induced warping of diaphragm 18. The conventional semiconductor device also includes at least one reference electrode 20 formed from second semiconductor and/or metal layer P2, at least one reference counter-electrode 22 formed from first semiconductor and/or metal layer P1, and at least one strip conductor feed 24 formed from first semiconductor and/or metal layer P1.

As is shown in FIG. 1b, the conventional semiconductor device is packaged in that substrate 10 is fastened at a circuit board 28 with the aid of a first adhesive layer 26 and circuit board 28 is bonded at a carrier substrate 32 with the aid of a second adhesive layer 30. A cover 34 having at least one air intake opening 36 is fastened at carrier substrate 32 in such a way that the micromechanical component is situated in an interior volume surrounded by carrier substrate 32 and the cover.

SUMMARY

The present invention provides a micromechanical component for a sensor device, a sensor device, and a manufacturing method for a micromechanical component for a sensor device.

Example embodiments of the present invention enable a warpable diaphragm of a micromechanical component/of a sensor device including the stiffening and/or protective structure protruding at the diaphragm exterior side of the diaphragm to be designed in a simple manner and with no significant increase in the manufacturing costs of the micromechanical component/of the sensor device. With the aid of a stiffening of the respective diaphragm effectuated in this manner, it is possible to improve the warping behavior thereof as a response to a pressure or to sound waves at its diaphragm exterior side for a sensory use of the diaphragm. The present invention also ensures an advantageous protection of the diaphragm from a contamination of the diaphragm exterior side and an increase of robustness of the diaphragm against mechanical stress. As is explained in greater detail below, the present invention also facilitates an integration of the micromechanical component into more cost-efficient and smaller packages. The present invention thus enables a reduction in manufacturing costs for micromechanical components/sensor devices, a reduction of their overall size and an increase in their robustness against contamination and mechanical stress.

In one advantageous specific embodiment of the micromechanical component in accordance with the present invention, the stiffening and/or protective structure includes at least one lattice protruding at the diaphragm exterior side. With the aid of the lattice protruding at the diaphragm exterior side, a reliable particle protection for the diaphragm exterior side is ensured, even when it is utilized as a sensor surface for measuring an external pressure on its diaphragm exterior side (with a known internal pressure in its diaphragm interior side) or for detecting sound waves.

All lattice openings of the lattice may, in particular, be water-impermeable. This is easily implementable by designing the lattice openings of the lattice so small/so narrow that gaseous media but not water droplets are able to pass through the lattice openings of the lattice. In this case, the lattice may thus reliably fulfill the functions of a Gore membrane.

As an alternative or in addition thereto, the stiffening and/or protective structure may also be coated at least partially with a hydrophobic protective layer. In this way as well, the diaphragm exterior side of the diaphragm may be protected from a wetting with liquids.

In one further advantageous specific embodiment of the present invention, the micromechanical component is molded at least partially with a molding compound, the molding compound covering at least partially the stiffening and/or protective structure. As explained in greater detail below, the micromechanical component may be molded with the molding compound due to its design that includes the stiffening and/or protective structure protruding at the diaphragm exterior side, the diaphragm exterior side of the diaphragm protected with the aid of the stiffening and/or protective structure nevertheless still being able to be reliably used as a sensor surface for measuring an external pressure at its diaphragm exterior side (with a known internal pressure at its diaphragm interior side) or for detecting sound waves.

In addition, a partial area of the diaphragm exterior side not covered by the molding compound and/or a part of the stiffening and/or protective structure not covered by the molding compound may be covered with a gel. The gelation in this case may be very easily implemented, since an escape of the gel through lateral boundaries in the molding compound may be reliably prevented.

In one further advantageous specific embodiment of the present invention, the micromechanical component is permanently bonded to a circuit board with the aid of a bonding material situated on the stiffening and/or protective structure. In this case as well, the stiffening and/or protective structure protruding at the diaphragm exterior side ensures that the diaphragm exterior side may continue to be used as a sensor surface for measuring an external pressure at its diaphragm exterior side (with a known internal pressure at its diaphragm interior side) or for detecting sound waves.

Alternatively or in addition, at least one chip-to-chip contact may be situated at the stiffening and/or protective structure, via which the micromechanical component is connected in each case electrically to the circuit board and/or to another circuit board. An electrical contacting of the micromechanical component is thus implementable in a comparatively easy manner.

The advantages described above are also ensured in a sensor device that includes such a micromechanical component. The sensor device may, for example, be a pressure sensor device and/or an inertial sensor device and/or a microphone.

An implementation of a corresponding manufacturing method for such a micromechanical component also yields the above-described advantages; the manufacturing method according to the specific embodiments of the present invention of micromechanical components explained above may be refined.

BRIEF DESCRIPTION OF THE DRAWINGS

Further features and advantages of the present invention are explained below with reference to the figures.

FIGS. 1a and 1b schematically show partial and overall views of a conventional semiconductor device.

FIGS. 2a and 2b schematically show partial and overall views of a first specific embodiment of the micromechanical component, in accordance with the present invention.

DETAILED DESCRIPTION OF EXAMPLE EMBODIMENTS

Figure 2B:
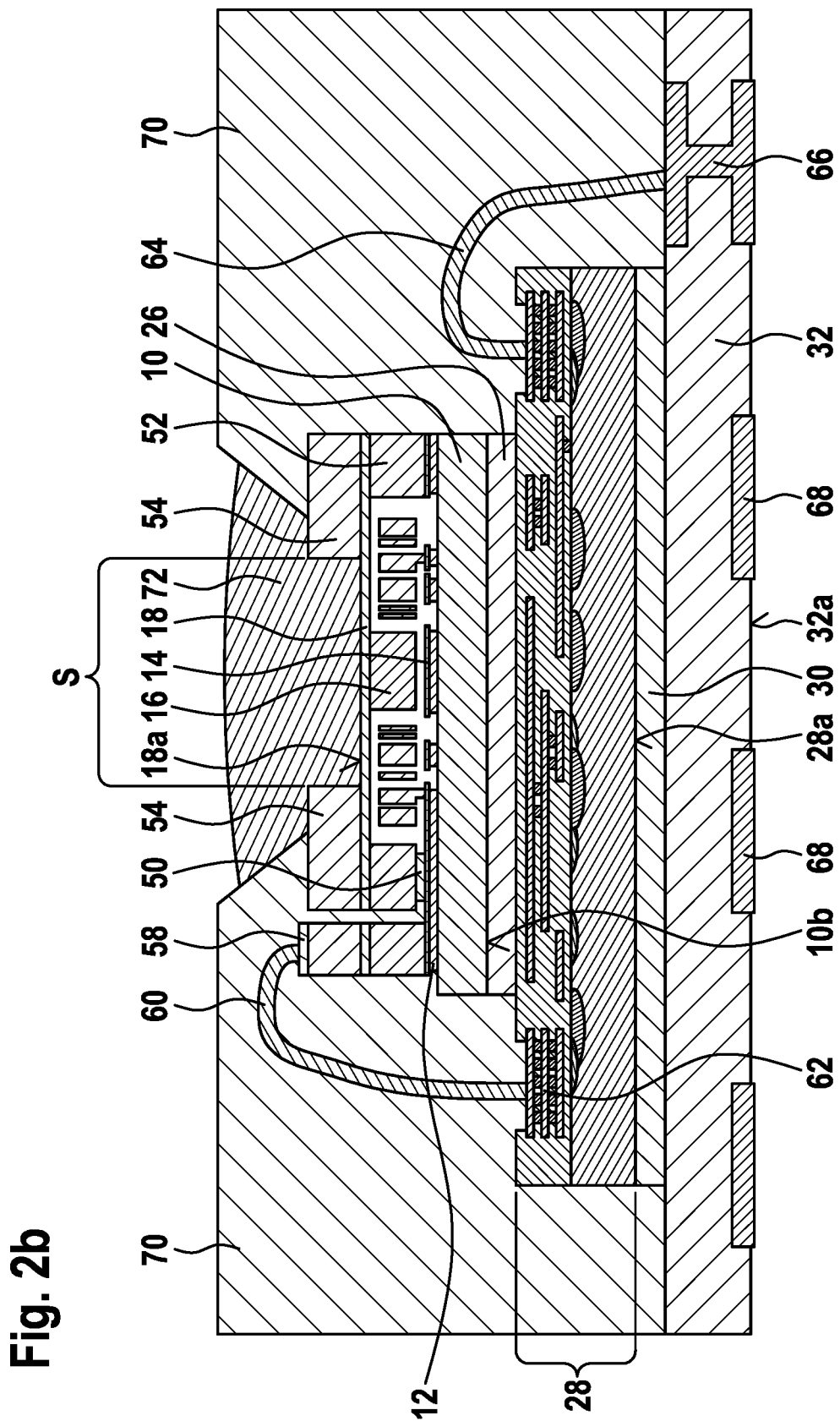

FIGS. 2a and 2b schematically show partial and overall views of a first specific embodiment of the micromechanical component.

The micromechanical component described in the following may be advantageously used as (part of) a sensor device. The sensor device may, for example, be a pressure sensor device or an inertial sensor device and/or a microphone. It is noted here, however, that the examples of sensor devices enumerated herein are not to be interpreted as conclusive.

The micromechanical component partially represented in FIG. 2a has a substrate 10 including a substrate surface 10a. Substrate 10 may, for example, be a semiconductor substrate, in particular, a silicon substrate. The micromechanical component also includes at least one stator electrode 14 situated on substrate surface 10a and/or on at least one intermediate layer 12 covering at least partially substrate surface 10a. The at least one stator electrode 14 is formed in each case from one first semiconductor and/or metal layer P1, which is deposited on substrate surface 10a and/or on the at least one intermediate layer 12. The first semiconductor and/or metal layer P1 may, for example, be a polycrystalline silicon layer. The at least one intermediate layer 12 is preferably an insulating layer such as, for example, a silicon dioxide layer and/or a silicon-rich nitride layer.

The micromechanical component also has at least one adjustably situated actuator electrode 16, which is formed in each case from a second semiconductor and/or metal layer P2. Second semiconductor and/or metal layer P2 may also be a polycrystalline silicon layer. Second semiconductor and/or metal layer P2 is deposited on first semiconductor and/or metal layer P1 and/or on at least one first sacrificial layer 50 covering first semiconductor and/or metal layer P1, which is possibly at least partially etched (away). The at least one first sacrificial layer may, for example, be a silicon dioxide layer.

Moreover, a diaphragm 18 that includes a diaphragm exterior side 18a directed away from the at least one stator electrode 14 and from the at least one actuator electrode 16 spans the at least one stator electrode 14 and the at least one actuator electrode 16. In the example of FIGS. 2a and 2b, diaphragm 18 spans a frame part 52 formed at least from second semiconductor and/or metal layer P2 in such a way that diaphragm 18 forms a hermetic encapsulation or thin layer capping of at least electrodes 14 and 16. Thus, at least the at least one stator electrode 14 and the at least one actuator electrode 16 are situated in a volume V spanned by diaphragm 18 and hermetically sealed, which ensures a reliable protection of electrodes 14 and 16.

Diaphragm 18 is preferably also at least partially warpable, for example, due to a pressure difference between an external pressure prevailing at its diaphragm exterior side 18a and an internal pressure prevailing at its diaphragm interior side 18b directed away from diaphragm exterior side 18a, or due to sound waves striking diaphragm exterior side 18a. In addition, the at least one actuator electrode 16 may be directly or indirectly suspended at diaphragm interior side 18b of diaphragm 18 in such a way that the at least one actuator electrode 16 is adjustable with respect to the at least one stator electrode 14 with the aid of a pressure-induced or sound wave-induced warping of diaphragm 18. In this case, diaphragm exterior side 18a of diagraph 18 may be utilized at least partially as a sensor surface S for measuring the external pressure (with a known internal pressure) or for detecting sound waves.

Diaphragm 18 is formed from a third semiconductor and/or metal layer P3. Third semiconductor and/or metal layer P3 may also be a polycrystalline silicon layer. Third semiconductor and/or metal layer P3 may, in particular, be deposited on second semiconductor and/or metal layer P2 and/or on at least one second sacrificial layer (not delineated) covering at least partially second semiconductor and/or metal layer P2, which is possibly at least partially etched (away). The at least one second sacrificial layer may also be a silicon dioxide layer.

In addition, the micromechanical component also includes a stiffening and/or protective structure 54, which protrudes at diaphragm exterior side 18a and is formed from a fourth semiconductor and/or metal layer P4. Fourth semiconductor and/or metal layer P4 is deposited on third semiconductor and/or metal layer P3 and/or on a layer (not depicted) covering at least partially third semiconductor and/or metal layer P3. Fourth semiconductor and/or metal layer P4 may also be a polycrystalline silicon layer. The at least one layer covering at least partially third semiconductor and/or metal layer P3 may be a sacrificial oxide layer, which is possibly at least partially etched (away).

With the aid of a stiffening of diaphragm 18 implemented by stiffening and/or protective structure 54 protruding at diaphragm exterior side 18a, it is possible to homogenize a gap spacing d between the at least one stator electrode 14 and its respectively assigned actuator electrode 16. It is also possible to increase a pressure sensitivity or sound wave sensitivity of the micromechanical component with the aid of the stiffening of diaphragm 18 implemented by stiffening and/or protective structure 54, and to suppress/reduce a non-linearity between a change of a pressure level prevailing on diaphragm exterior side 18a and a change of gap spacing d.

Moreover, a diaphragm span width of diaphragm 18, or expansions of sensor surface S may be established via a dimensioning of fourth semiconductor and/or metal layer P4, whereas a lateral dimension of third semiconductor and/or metal layer P3 as a hermetic encapsulation or thin layer capping takes place regardless of the subsequent diaphragm span width of diaphragm 18. Volume V spanned and hermetically sealed by diaphragm 18 may thus be comparatively large without also having to take the disadvantages of a comparatively large diaphragm span width into account. As is explained in greater detail below, stiffening and/or protective structure 54 protruding at diaphragm exterior side 18a may also be utilized for protecting diaphragm exterior side 18a from soiling, from wetting with a liquid, and from damage.

The possibility of spanning and hermetically sealing a comparatively large volume V with the aid of diaphragm 18 may be utilized for integrating at least one further sensor electrode 56 (in addition to electrodes 14 and 16) into volume V. In the specific embodiment of FIGS. 2a and 2b, at least one seismic mass 56, for example, in addition to electrodes 14 and 16, is also integrated as "inertial sensor electrode 56" into volume V. The at least one further sensor electrode/seismic mass 56 may, for example, be formed from second semiconductor and/or metal layer P2. At least one counter-electrode (not delineated) interacting with the at least one further sensor electrode/seismic mass 56, which is also integrated into volume V, may be formed from first semiconductor and/or metal layer P1 or from second semiconductor and/or metal layer P2. As an alternative or in addition to the at least one further sensor electrode/seismic mass 56 and to its at least one counter-electrode, the at least one reference electrode described above and its at least one reference counter-electrode may also be integrated into volume V. In addition, at least one strip conductor feed 24 may also be formed from first semiconductor and/or metal layer P1.

Stiffening and/or protective structure 54 protruding at diaphragm exterior side 18a may also facilitate an electrical contacting of the micromechanical component. For example, at least one bond pad 58 may be fastened to stiffening and/or protective structure 54 without this impairing a deformability of diaphragm 18, in particular of its sensor surface S.

As is shown in FIG. 2b, the micromechanical component described herein may easily be integrated/may easily become integrated into a package, for example, in that a fastening surface 10b of substrate 10 directed away from substrate surface 10a is fastened/is to be fastened to a circuit board 28 with the aid of a first adhesive layer 26, and a fastening surface 28a of circuit board 28 is permanently bonded/is to be permanently bonded to a carrier substrate 32 with the aid of a second adhesive layer 30. To electrically contact the micromechanical component with circuit board 28, the at least one bond pad 58 is connected/is to be connected via one wire bond 60 each to one contact 62 each of circuit board 28. If desired, circuit board 28 may also be electrically connected/may become electrically connected via at least one further wire bond 64 to a contact 66 of carrier substrate 32. A fastening surface 32a of carrier substrate 32 directed away from the micromechanical component and circuit board 28 may optionally also be fastenable to a further device via at least one solder pad 68 fastened thereto. Circuit board 28 may, in particular, be a silicon chip including a CMOS circuit for activating and for reading out the micromechanical component.

Figure 1B:
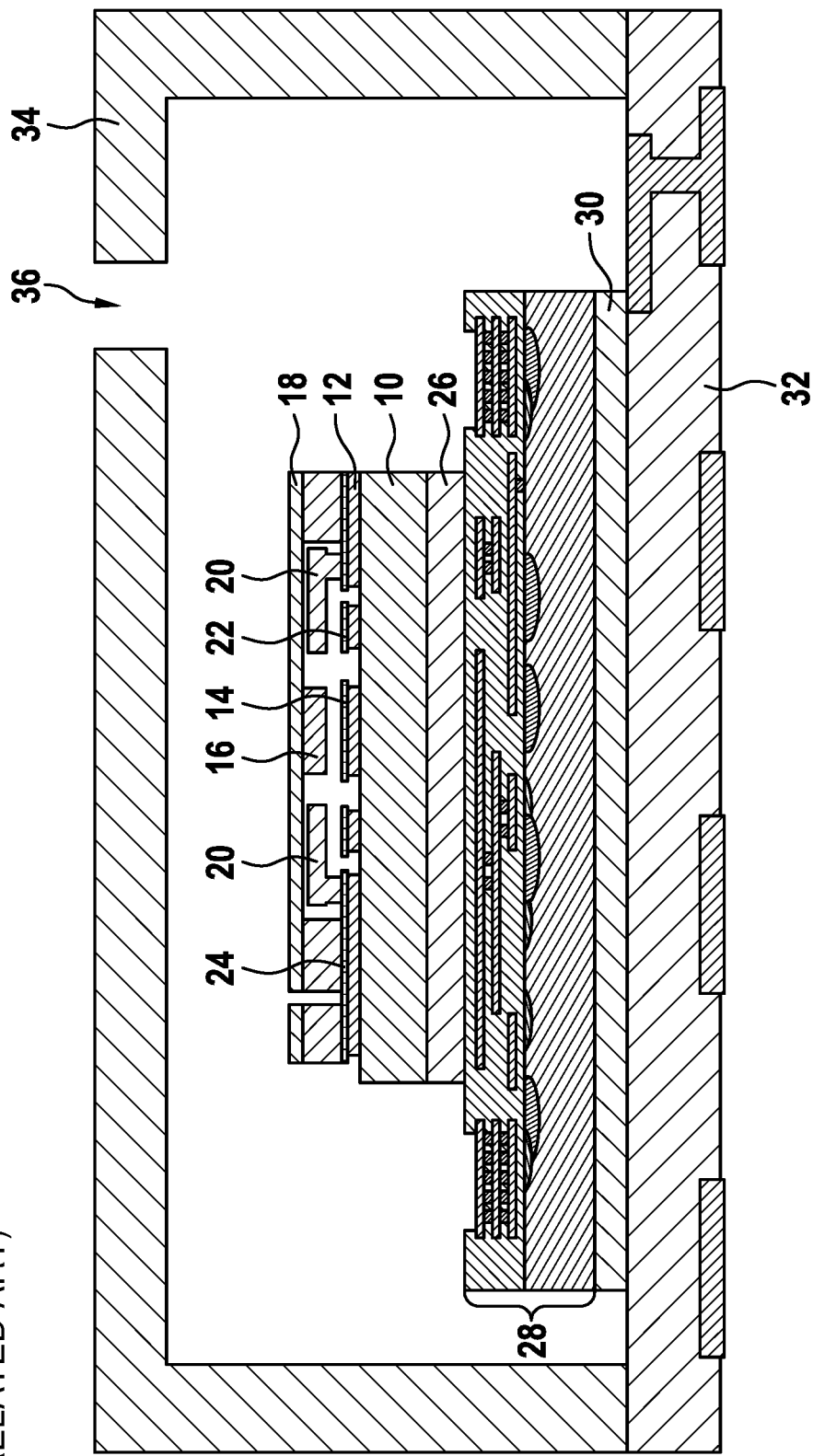

The micromechanical component is also molded at least partially with a molding compound 70, molding compound 70 covering at least partially stiffening and/or protective structure 54. Sensor surface S of diaphragm 18 is left uncovered by molding compound 70 during the molding process in order to further ensure the advantageous sensitivity of sensor surface S. The package depicted in FIG. 2b, which may also be referred to as a film-assisted mold package, is manufacturable in a significantly more cost-efficient manner than the packaging according to the related art delineated in FIG. 1b. It is noted that since the edge of molding compound 70 contacts merely stiffening and/or protective structure 54 and not diaphragm 18, the diaphragm span width of diaphragm 18, or the expansions of sensor surface S are not changed, even in the case of fluctuations in the molding process. (An edge position of the solidified molding compound 70 may vary slightly during molding processes.) As an advantageous refinement, another partial surface of diaphragm exterior side 18a not covered by molding compound 70 and/or a part of stiffening and/or protective structure 54 not covered by molding compound 70 is covered with a gel 72 in the specific embodiment of FIGS. 2a and 2b. The gelation is easily implementable, since an escape of the gel 72 through the lateral boundaries of the molding compound 70 may be reliably prevented. The use of gel 72 improves a robustness of diaphragm 18 against contaminations, since no deposits are able to form on diaphragm exterior side 18a/sensor surface S and even reactive chemicals are unable/barely able to attack diaphragm exterior side 18a/sensor surface S. Thus, a pressure sensitivity or sound wave sensitivity of diaphragm 18 remains unimpaired, even in the presence of reactive chemicals.

Figure 3:
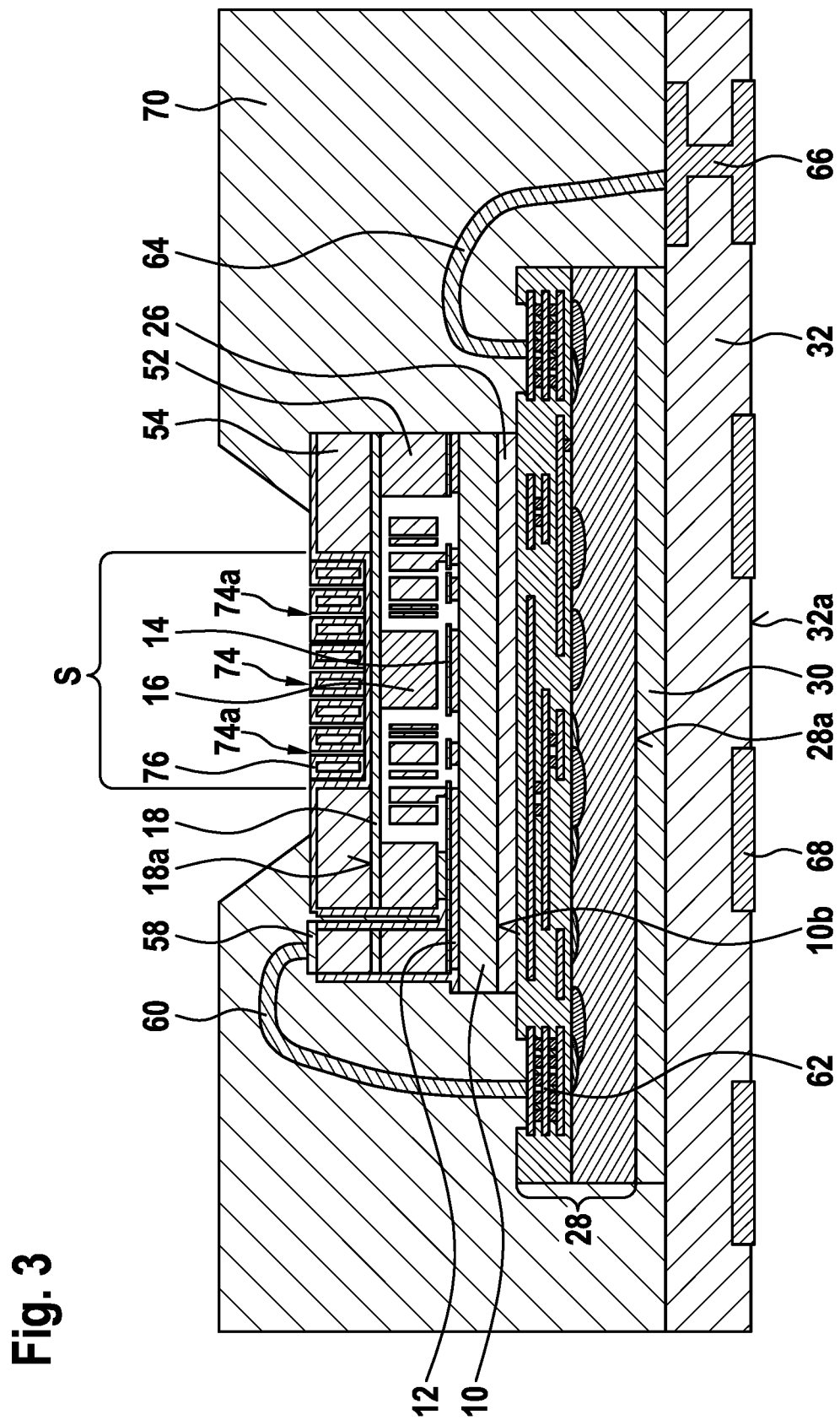
FIG. 3 schematically shows an overall view of a second specific embodiment of the micromechanical component, in accordance with the present invention.

FIG. 3 schematically shows an overall view of a second specific embodiment of the micromechanical component.

The micromechanical component schematically represented in FIG. 3 also includes, in addition to the above-described specific embodiment, a lattice 74 protruding at diaphragm exterior side 18a as part of its stiffening and/or protective structure 54. Lattice 74, as a "protective lattice," enables a particle protection of diaphragm exterior side 18a in order to prevent a contamination of diaphragm exterior side 18a. Another electrical potential may optionally be applied to lattice 74, which is different from that applied to diaphragm 18, in which case lattice 74 also ensures a shielding of diaphragm 18 from electromagnetic radiation and, in this way, improves an electromagnetic robustness of the micromechanical component. Moreover, stiffening and/or protective structure 54 is coated at least partially with a hydrophobic protective layer 76, thereby implementing a moisture protection of diaphragm 18. Alternatively or in addition to hydrophobic protective layer 76, all lattice openings 74a of lattice 74 may also be designed to be so small that they are water-impermeable. With the aid of a sufficiently fine perforation of lattice 74, lattice 74 is thus able to also fulfill the functions of a Gore membrane. In this case, gas molecules are still able to easily diffuse through lattice openings 74a of lattice 74, but liquid droplets are held off from diaphragm 18 by lattice 74. If a coating of the at least one bond pad 58 with hydrophobic protective layer 76 is undesirable, for example, because the at least one bond pad 58 is made of aluminum, hydrophobic coating 76 may be selectively removed from the at least one bond pad 58 via a tempering step. In general, this is not necessary, however, since hydrophobic coating 76 is formable to be so thin that it may be easily penetrated during wire bonding and still ensure a reliable fluid protection of diaphragm 18.

With respect to further features of the micromechanical component of FIG. 3 and its advantages, reference is made to the above-described specific embodiment.

Figure 4:
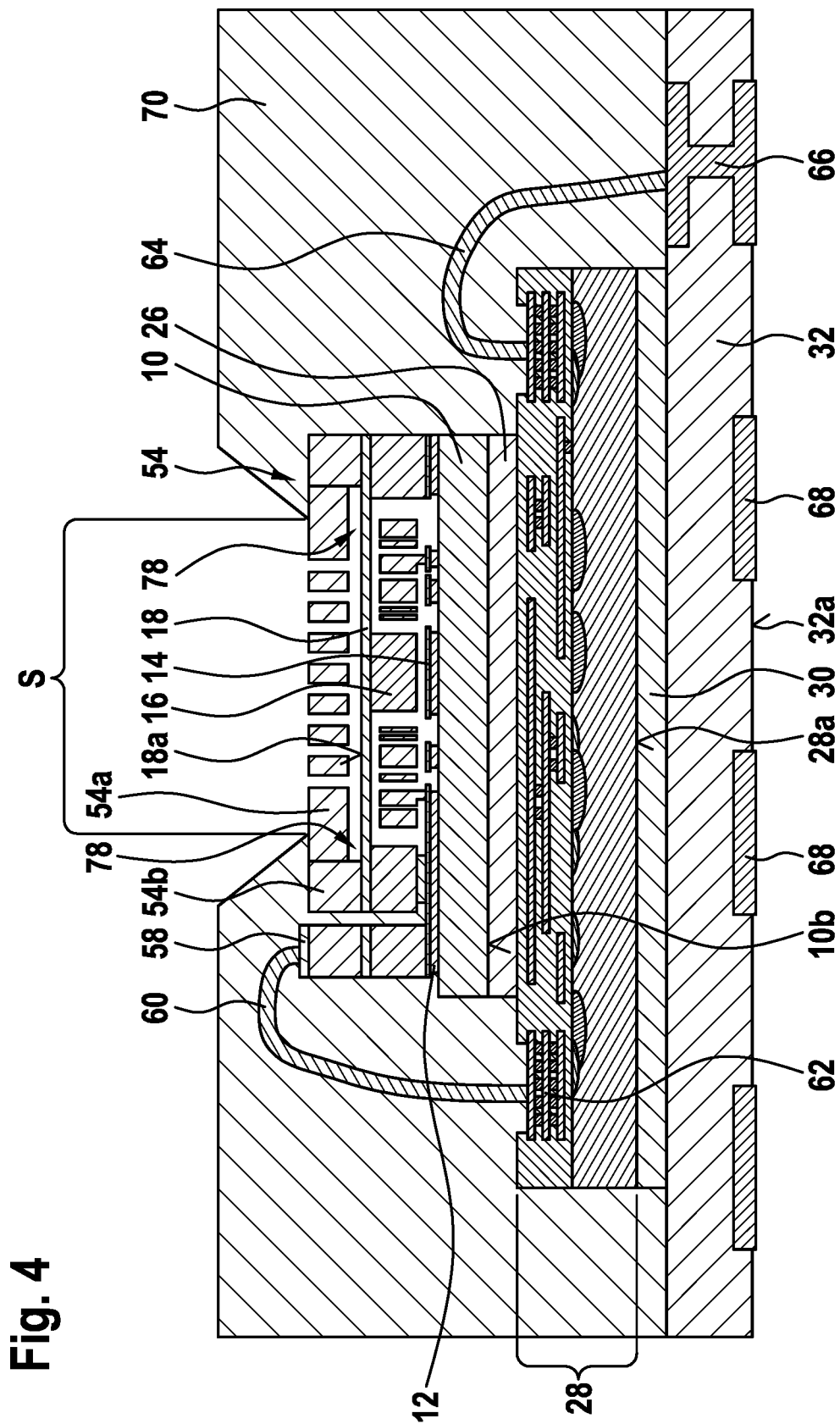
FIG. 4 schematically shows an overall view of a third specific embodiment of the micromechanical component, in accordance with the present invention.

FIG. 4 schematically shows an overall view of a third specific embodiment of the micromechanical component.

The micromechanical component schematically represented in FIG. 4 differs from the specific embodiment of FIGS. 2a and 2b merely by lattice 74 and by a gap 78 formed between diaphragm exterior side 18a of its diaphragm 18 and at least one exposed area 54a of its stiffening and/or protective structure 54. Stiffening and/or protective structure 54 contacts diaphragm 18 merely with the aid of at least one anchored area 54b of stiffening and/or protective structure 54. The design of stiffening and/or protective structure 54 with its at least one exposed area 54a, which is spaced around gap 78 of diaphragm 18, increases a stress robustness of diaphragm 18, in that gap 78 prevents/inhibits an introduction of mechanical stress via stiffening and/or protective structure 54 into diaphragm 18. Gap 78 thus ensures an advantageous stress decoupling of diaphragm 18. Even if molding compound 70 situated on stiffening and/or protective structure 54 transfers a certain mechanical stress onto stiffening and/or protective structure 54 due to its thermal expansion coefficients deviating significantly from the material of diaphragm 18, or due to changes in material properties during the product service life, gap 78 prevents stress from being transferred to diaphragm 18.

With regard to further features of the micromechanical component of FIG. 4 and its advantages, reference is made to the specific embodiment of FIGS. 2a and 2b.

Figure 5:
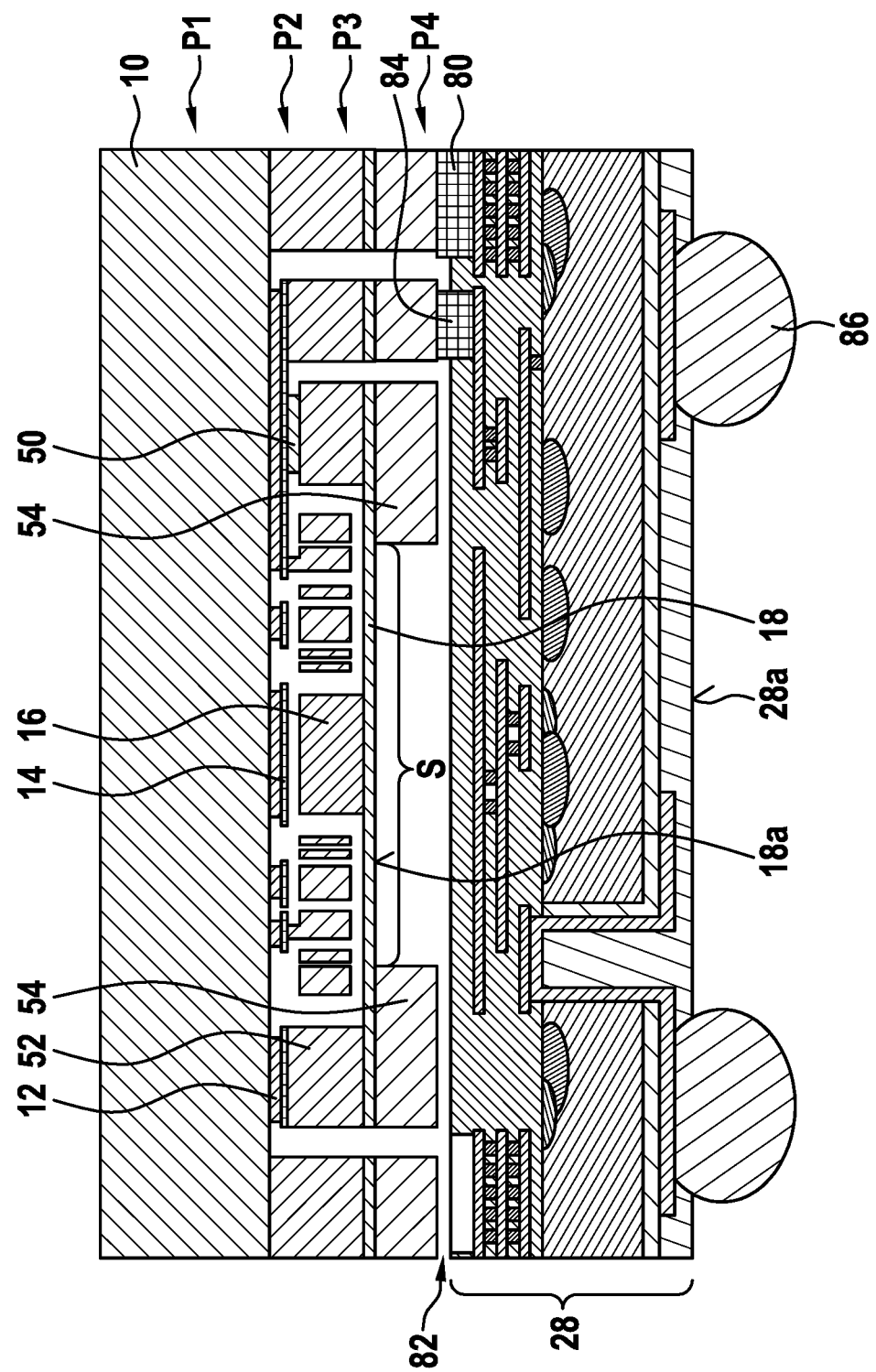
FIG. 5 schematically shows an overall view of a fourth specific embodiment of the micromechanical component, in accordance with the present invention.

FIG. 5 schematically shows an overall view of a fourth specific embodiment of the micromechanical component.

In contrast to the above-described specific embodiments, the micromechanical component schematically depicted in FIG. 5 is packaged by permanently bonding the micromechanical component to a circuit board 28 with the aid of a bonding material 80 situated on stiffening and/or protective structure 54. Here as well, circuit board 28 may, in particular, be a silicon chip including a CMOS circuit for activating and for reading out the micromechanical component. Bonding material 80 may, in particular, be formed as a "bond frame." With the aid of at least one opening formed in the "bond frame," a pressure access or sound wave access 82 is implementable from an exterior side of the packaged micromechanical component to the (partial surface of) diaphragm exterior side 18a of diaphragm 18 utilized as sensor surface S. Pressure access or sound wave access 82 may be designed as a channel between two adjacent layers of semiconductor and/or metal layers P1, P2, P3, and P4. A sufficient protection from a penetration of contaminations or liquids is ensurable with the aid of a comparatively thin design of the channel.

At least one chip-to-chip contact 84, via which the micromechanical component is connected in each case electrically to circuit board 28, may also optionally be situated at stiffening and/or protective structure 54. A metallic bonding method, a eutectic bonding method, a direct bonding method, or a thermo-compression bonding method may be carried out to form the at least one chip-to-chip contact 84. A eutectic bonding method is preferably carried out using aluminum and using germanium or copper and tin. Circuit board 28 may be fastened to a further device with the aid of at least one solder ball 86 situated on a fastening surface 28a of circuit board 28 directed away from the micromechanical component.

With regard to further features of the micromechanical component of FIG. 5 and its advantages, reference is made to the specific embodiment of FIGS. 2a and 2b.

All of the above-described micromechanical components may be used as sensor devices such as, for example, as pressure sensor devices and/or inertial sensor devices and/or as microphones, in particular, for consumer or automotive applications. The above-described packages are significantly more cost-efficiently manufacturable than the package according to the related art schematically represented in FIG. 1b. Moreover, the above-described packages provide a minimization of effects resulting from mechanical stress and an increase in robustness of the respective micromechanical component against contaminations.

Figure 6:
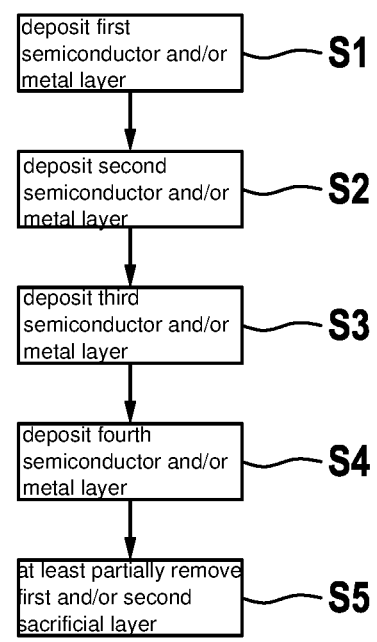
FIG. 6 shows a flowchart for explaining one specific embodiment of the manufacturing method, in accordance with the present invention.

FIG. 6 shows a flowchart for explaining one specific embodiment of the manufacturing method in accordance with the present invention.

All of the above-described micromechanical components may be manufactured with the aid of the manufacturing method described in the following. An executability of the manufacturing method is not limited, however, to these micromechanical components.

In one method step S1, a first semiconductor and/or metal layer is deposited on a substrate surface of a substrate and/or on at least one intermediate layer covering at least partially the substrate surface. Examples of the materials of the first semiconductor and/or metal layer and of the at least one intermediate layer are already cited above. At least one stator electrode situated on the substrate surface and/or on the at least one intermediate layer is formed from the first semiconductor and/or metal layer.

As method step S2, a second semiconductor and/or metal layer is then deposited on the first semiconductor and/or metal layer and/or on at least one first sacrificial layer covering at least partially the first semiconductor and/or metal layer. Possible materials for the second semiconductor and/or metal layer and the at least one first sacrificial layer are also already cited above. At least one actuator electrode is formed from the second semiconductor and/or metal layer.

In a further method step S3, a third semiconductor and/or metal layer is deposited on the second semiconductor and/or metal layer and/or on at least one second sacrificial layer covering at least partially the second semiconductor and/or metal layer. Examples of the materials of the third semiconductor and/or metal layer and of the at least one second sacrificial layer are already described above. At least one diaphragm spanning the at least one stator electrode and the at least one actuator electrode is formed from the third semiconductor and/or metal layer with a diaphragm exterior side directed away from the at least one stator electrode and the at least one actuator electrode. The at least one actuator electrode may optionally be directly or indirectly fastened to a diaphragm interior side of the diaphragm directed away from the diaphragm exterior side.

A deposition of a fourth semiconductor and/or metal layer on the diaphragm exterior side and/or on the at least one layer covering at least partially the diaphragm exterior side is carried out as method step S4. A polycrystalline silicon layer may, for example, be deposited as a fourth semiconductor and/or metal layer. At least one stiffening and/or protective structure protruding at the diaphragm exterior side is formed from the fourth semiconductor and/or metal layer. The at least one layer covering at least partially the diaphragm exterior side may be a sacrificial oxide layer, whose structuring establishes at least one contact surface of the stiffening and/or protective structure at the diaphragm exterior side and, possibly also at least one contact hole. If the at least one layer is removed from at least a partial surface of the diaphragm exterior side before the fourth semiconductor and/or metal layer is deposited, the stiffening and/or protective layer contacts the diaphragm exterior side at the at least one partial surface. However, at least partial areas of the at least one layer may also be utilized as an etch stop during the structuring of the stiffening and/or protective structure. If desired, the at least one layer may be subsequently removed with the aid of an etching method, preferably using gaseous hydrogen fluoride.

In a method step S5 carried out before or after method step S4, the at least one first sacrificial layer and/or the at least one second sacrificial layer is/are at least partially removed in such a way that the at least one actuator electrode is adjustably situated. Multiple etching steps, possibly before and after method step S4, may also be carried out as method step S5. A warpability of the diaphragm may also be ensured with the aid of method step S5 so that a pressure-induced or sound wave-induced warping of the diaphragm is possible. If the at least one actuator electrode is directly or indirectly fastened to the diaphragm interior side of the diaphragm, the at least one actuator electrode is adjustable with respect to the at least one stator electrode with the aid of a pressure-induced and/or sound wave-induced warping of the diaphragm. With the aid of the design of the stiffening and/or protective structure, it is possible to establish a diaphragm diameter of the diaphragm. This introduces additional design freedom for configuring the diaphragm diameter of the diaphragm, since the diaphragm diameter of the diaphragm may be very precisely set via a trench process carried out for forming the stiffening and/or protective structure.

Further features of the above-described micromechanical components may also be implemented with the aid of additional method steps. The features of the above-described packages, in particular, may be implemented. However, a repeated description of these features is omitted here.

What is claimed is:

1. A micromechanical component for a sensor device, comprising:
   a substrate including a substrate surface;
   at least one stator electrode situated on the substrate surface and/or on at least one intermediate layer covering at least partially the substrate surface, which is formed in each case from a first semiconductor and/or metal layer;
   at least one adjustably situated actuator electrode which is formed in each case from a second semiconductor and/or metal layer;
   a diaphragm spanning the at least one stator electrode and the at least one actuator electrode, including a diaphragm exterior side directed away from the at least one stator electrode and the at least one actuator electrode, which is formed from a third semiconductor and/or metal layer; and
   a stiffening and/or protective structure protruding at the diaphragm exterior side, which is formed from a fourth semiconductor and/or metal layer,
   wherein the stiffening and/or protective structure includes at least one lattice protruding at the diaphragm exterior side,
   wherein a gap is formed between the diaphragm exterior side and at least one exposed area of the stiffening and/or protective structure.

2. The micromechanical component as recited in claim 1, wherein all lattice openings of the lattice are water-impermeable.

3. The micromechanical component as recited in claim 1, wherein the stiffening and/or protective structure is coated at least partially with a hydrophobic protective layer.

4. The micromechanical component as recited in claim 1, wherein the micromechanical component is molded at least partially with a molding compound, the molding compound covering at least partially the stiffening and/or protective structure.

5. The micromechanical component as recited in claim 4, wherein a partial surface of the diaphragm exterior side not covered by the molding compound and/or a part of the stiffening and/or protective structure not covered by the molding compound, is covered with a gel.

6. The micromechanical component as recited in claim 1, wherein the micromechanical component is permanently bonded to a circuit board using a bonding material situated on the stiffening and/or protective structure.

7. The micromechanical component as recited in claim 1, wherein at least one chip-to-chip contact, via which the micromechanical component is connected in each case electrically to the circuit board and/or to another circuit board, is situated at the stiffening and/or protective structure.

* * * * *